US010269703B2

(12) United States Patent
Ku et al.

(10) Patent No.: US 10,269,703 B2
(45) Date of Patent: Apr. 23, 2019

(54) SEMICONDUCTOR DEVICE AND METHOD OF FORMING THE SAME

(71) Applicant: TAIWAN SEMICONDUCTOR MANUFACTURING COMPANY LTD., Hsinchu (TW)

(72) Inventors: Chin-Yu Ku, Hsinchu (TW); Sheng-Pin Yang, Kaohsiung (TW); Chen-Shien Chen, Hsinchu County (TW); Hon-Lin Huang, Hsinchu (TW); Chien-Chih Chou, New Taipei (TW); Ting-Li Yang, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 3 days.

(21) Appl. No.: 15/434,644

(22) Filed: Feb. 16, 2017

(65) Prior Publication Data

US 2018/0151493 A1    May 31, 2018

Related U.S. Application Data

(60) Provisional application No. 62/427,645, filed on Nov. 29, 2016.

(51) Int. Cl.
*H01L 23/522* (2006.01)
*H01L 49/02* (2006.01)
*H01L 21/768* (2006.01)
*H01L 23/532* (2006.01)

(52) U.S. Cl.
CPC .... *H01L 23/5227* (2013.01); *H01L 21/76802* (2013.01); *H01L 28/10* (2013.01); *H01L 23/53238* (2013.01); *H01L 2224/0401* (2013.01); *H01L 2224/05572* (2013.01)

(58) Field of Classification Search
CPC ............... H01L 23/5226; H01L 23/585; H01L 21/76802; H01L 28/10; H01L 23/645
See application file for complete search history.

(56) References Cited

U.S. PATENT DOCUMENTS

| | | |
|---|---|---|
| 8,279,008 B2 | 10/2012 | Hsieh et al. |
| 8,427,240 B2 | 4/2013 | Hsieh et al. |
| 8,593,206 B2 | 11/2013 | Chen et al. |
| 8,610,494 B1 | 12/2013 | Jin et al. |
| 8,618,631 B2 | 12/2013 | Jin et al. |
| 8,912,581 B2 | 12/2014 | Lin et al. |
| 8,941,212 B2 | 1/2015 | Yen et al. |

(Continued)

*Primary Examiner* — Evren Seven
*Assistant Examiner* — Long H Le
(74) *Attorney, Agent, or Firm* — WPAT, P.C., Intellectual Property Attorneys; Anthony King

(57) ABSTRACT

A semiconductor device includes: a first conductive line disposed on a substrate, a second conductive line disposed on the substrate, and the second conductive line separated with the first conductive line by a trench; an insulating layer disposed on the first conductive line and the second conductive line, and filled the trench between the first conductive line and the second conductive line; and a magnetic film having a first surface and a second surface opposite to the first surface, and the first surface disposed on the insulating layer; wherein the first surface has a first concave directly above the trench, and the first concave has a first obtuse angle of at least 170 degree.

20 Claims, 17 Drawing Sheets

(56) References Cited

U.S. PATENT DOCUMENTS

| | | | |
|---|---|---|---|
| 9,184,256 B2 | 11/2015 | Huang et al. | |
| 9,209,521 B2 | 12/2015 | Hung et al. | |
| 2002/0008605 A1* | 1/2002 | Gardner | H01F 17/0006 336/200 |
| 2004/0016948 A1* | 1/2004 | Lin | H01L 23/522 257/300 |
| 2010/0276791 A1* | 11/2010 | Kaneko | H01L 23/5225 257/659 |
| 2012/0286264 A1* | 11/2012 | Suzuki | H01L 27/1225 257/43 |
| 2014/0132333 A1 | 5/2014 | Jin et al. | |
| 2014/0253262 A1 | 9/2014 | Hsieh et al. | |
| 2014/0253391 A1 | 9/2014 | Yen | |
| 2015/0364417 A1 | 12/2015 | Lee | |

* cited by examiner

SEMICONDUCTOR DEVICE AND METHOD OF FORMING THE SAME

CROSS-REFERENCE TO RELATED APPLICATION

This application claims the benefit of U.S. Provisional Application No. 62/427,645, filed on Nov. 29, 2016.

BACKGROUND

The semiconductor integrated circuit (IC) industry has experienced exponential growth. Technological advances in IC materials and design have produced generations of ICs where each generation has smaller and more complex circuits than the previous generation. Semiconductor ICs may often be in need of inductors. Such may be the case for analog, or mixed analog/digital circuits. Inductors are also needed as transformers, and as energy storage elements. In the semiconductor ICs, an inductor may include a thin film coil and a magnetic thin film, in which the thin film coil surrounds the magnetic thin film. In some existing arts, concaves may be formed on is the magnetic thin film when the inductor is embedded with a semiconductor IC, which may degrade the inductance performance, such as the magnetic permeability, of the inductor. Therefore, there is a need to provide a novel method to form a high quality inductor in a semiconductor IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
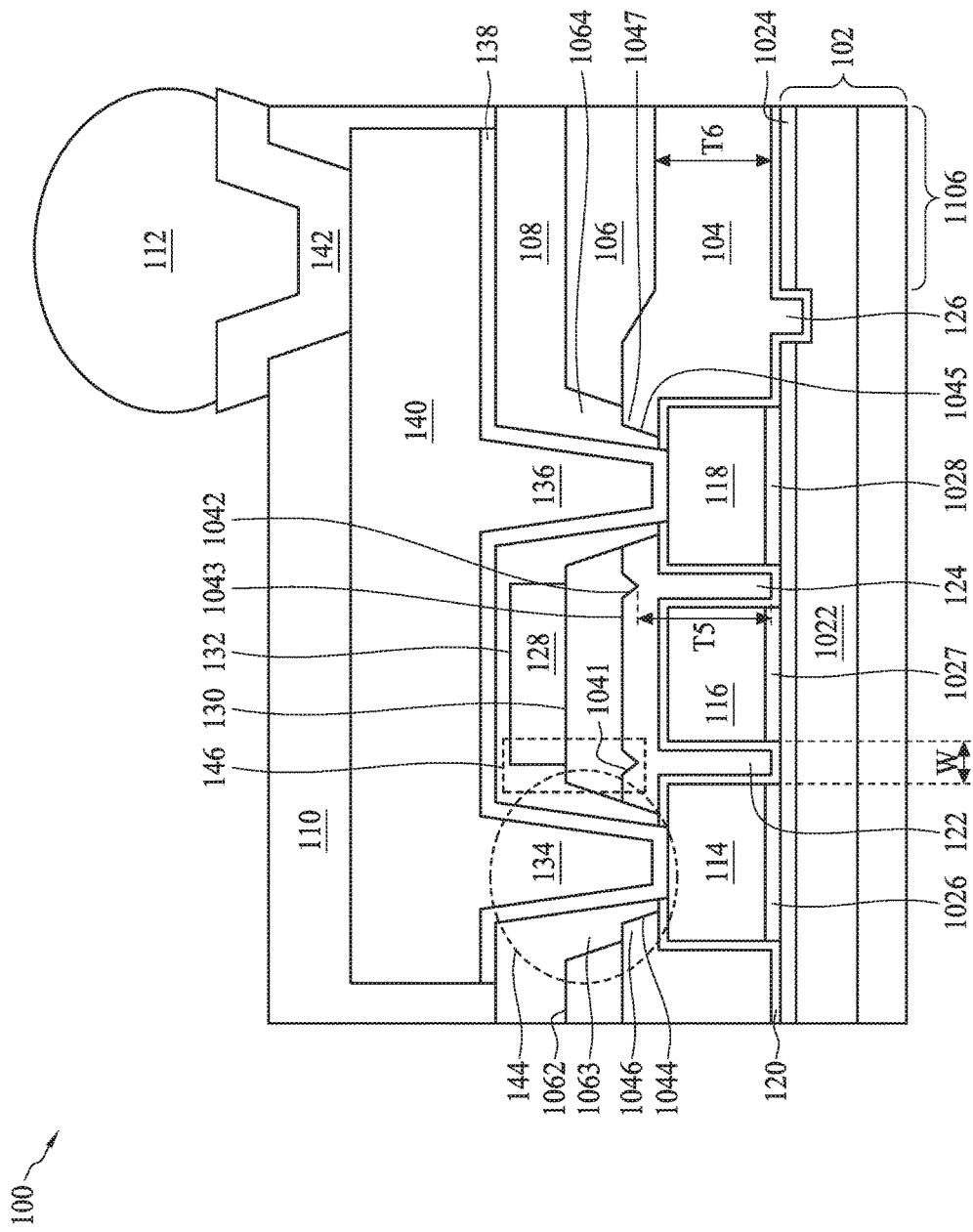
FIG. 1 is a diagram illustrating a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a diagram illustrating a semiconductor device 100 in accordance with some embodiments. The semiconductor device 100 may be a thin film inductor. FIG. 1 is a cross sectional diagram of the thin film inductor. The semiconductor device 100 comprises a semiconductor substrate 102, a first insulating layer 104, a second insulating layer 106, a third insulating layer 108, a fourth insulating layer 110, and a solder ball 112. A first conducive line 114, a second conducive line 116, and a third conducive line 118 are formed on a surface 120 of the substrate 102. The substrate 102 comprises an oxide layer 1022 and a silicon nitride (SiN) layer 1024. In the cross sectional view of FIG. 1, the first conducive line 114, the second conducive line 116, and the third conducive line 118 are separated with each other a first trench 122 and a second trench 124. The first insulating layer 104 is disposed on the substrate 102, the first conducive line 114, the second conducive line 116, and the third conducive line 118. The first insulating layer 104 also fills the first trench 122 and the second trench 124. Another trench 126 is formed on the surface 120 of the substrate 102. The trench 126 is an alignment mark used in the fabrication process. The trench 126 is also disposed by the first insulating layer 104. In addition, a plurality of barrier seed layers 1026, 1027, and 1028 are formed between the first conducive line 114, the second conducive line 116, and the third conducive line 118 and the silicon nitride layer 1024 respectively. The barrier seed layers 1026, 1027, and 1028 may be titanium (Ti) or copper (Cu) sputtering layer. The first conducive line 114, the second conducive line 116, and the third conducive line 118 may be composed of copper.

A first concave 1041 and a second concave 1042 are formed on the surface 1043 of the first insulating layer 104. The first concave 1041 and the second concave 1042 are positioned directly above the first trench 122 and the second trench 124 respectively. The first concave 1041 and the second concave 1042 are caused by the first trench 122 and the second trench 124 respectively during the forming of the first insulating layer 104. For example, when the depths of the trenches 122 and 124 are greater than 10 um, i.e. the thickness of the conducive lines 114, 116, 118 are greater than 10 um, the viscosity of the first insulating layer 104 may cause the first concave 1041 and the second concave 1042 above the first trench 122 and the second trench 124 respectively during the coating of the first insulating layer 104. According to some embodiments, the first concave 1041 and the second concave 1042 have obtuse angles of about 150 degree.

To planarize the first concave 1041 and the second concave 1042 on the first insulating layer 104, the second insulating layer 106 is disposed on the surface 1043 of the first insulating layer 104. According to some embodiments, the first insulating layer 104 and the second insulating layer 106 are composed of the same material. For example, the first insulating layer 104 and the second insulating layer 106 are composed of polybenzoxazole (PBO) polymer. As the first insulating layer 104 and the second insulating layer 106 are composed of the same material, the interface (i.e. 1043) between the first insulating layer 104 and the second insulating layer 106 may be indistinct after the fabrication process. However, the interface (i.e. 1043) between the first insulating layer 104 and the second insulating layer 106 can still be identified by some existing techniques.

When the second insulating layer 106 is disposed on the first insulating layer 104, the viscosity of the second insulating layer 106 may make the surface 1062 of the second insulating layer 106 to be a planar surface even though the first concave 1041 and the second concave 1042 are positioned under the second insulating layer 106. However, in some embodiments, there may a third concave and a four concave formed on the surface 1062 of the second insulating layer 106. The third concave and the four concave are positioned directly above the first concave 1041 and the second concave 1042 respectively. The third concave and the four concave have obtuse angles of at least 170 degree, which is close to the planar surface. Therefore, the third concave and the four concave are not shown in FIG. 1 for brevity. It is noted that, when the surface 1062 of the second insulating layer 106 is a planar surface, the obtuse angles of the third concave and the four concave are 180 degree.

A magnetic film 128 is disposed on the surface 1062 of the second insulating layer 106. The magnetic film 128 may be a CdZnTe (CZT) film. The magnetic film 128 disposed directly above the first trench 122 and the second trench 124. According to some embodiments, the magnetic film 128 may dispose on the third concave and the four concave on the surface 1062 of the second insulating layer 106. The magnetic film 128 has a first surface 130 and a second surface 132 opposite to the first surface 130. When the magnetic film 128 is disposed on the third concave and the four concave on the surface 1062, the shape of the magnetic film 128 may be affected by the third concave and the four concave. For example, the first surface 130 of the magnetic film 128 may have a first convex and a second convex corresponding to the third concave and the fourth concave respectively. The second surface 132 of the magnetic film 128 may have a first concave and a second concave directly above the first convex and the second convex respectively. As mentioned above, the third concave and the four concave are close to planar surface (i.e. at least 170 degree of obtuse angle). Therefore, the first convex and the second convex on the first surface 130, and the first concave and the second concave on the second surface 132 of the magnetic film 128 are also close to planar surface. It should be noted that, when the surface 1062 of the second insulating layer 106 is a planar surface (i.e. 180 degree of obtuse angle), the interface between the magnetic film 128 and the second insulating layer 106 is a planar interface. For brevity, the first convex and the second convex on the first surface 130, and the first concave and the second concave on the second surface 132 of the magnetic film 128 are not shown in FIG. 1.

In addition, a first via structure 134 and a second via structure 136 are formed on the first conductive line 114 and the third conductive line 118 respectively. To form the first via structure 134 and the second via structure 136, the first insulating layer 104 is arranged to form a first hole 1044 and a second hole 1045 on the first conductive line 114 and the third conductive line 118 respectively, and the second insulating layer 106 is also arranged to form a first hole 1063 and a second hole 1064 on the first hole 1044 and the second hole 1045 respectively. The first hole 1063 and the second hole 1064 are above and aligned to the first hole 1044 and the second hole 1045 respectively. For the first insulating layer 104, the diameters of the first hole 1044 and the second hole 1045 monotonically decrease form the surface 1043 to the first conductive line 114 and the third conductive line 118 respectively. For the second insulating layer 106, the diameters of the first hole 1063 and the second hole 1064 also monotonically decrease form the surface 1062 to the surface 1043. According to some embodiments, the first holes 1044, 1063, and the second holes 1045, 1064 have tapered sidewalls as shown in FIG. 1. Moreover, the diameters of the first hole 1063 and the second hole 1064 are greater than the diameters of the first hole 1044 and the second hole 1045 respectively. Accordingly, a first kink structure 1046 is formed on the interface between the first hole 1044 and the first hole 1063, and a second kink structure 1047 is formed on the interface between the second hole 1045 and the second hole 1064. The first kink structure 1046 and the second kink structure 1047 are two step structures on the sidewalls respectively.

The third insulating layer 108 is disposed on the sidewalls of the holes 1044, 1045, 1063, 1064, the first insulating layer 104, the second insulating layer 106, and the magnetic film 128. According to some embodiments, the first insulating layer 104, the second insulating layer 106, and the third insulating layer 108 are composed of the same material.

A barrier seed layer 138 is disposed on the third insulating layer 108. A conductive material, such as copper, is disposed on the barrier seed layer 138 to form the first via structure 134 and the second via structure 136. Accordingly, the first via structure 134 and the second via structure 136 are surrounded by the first insulating layer 104, the second insulating layer 106, and the third insulating layer 108. The conductive material may further be plated to form a conductive path 140. The fourth insulating layer 110 is disposed on the conductive path 140. According to some embodiments, the first insulating layer 104, the second insulating layer 106, the third insulating layer 108, and the fourth insulating layer 110 are composed of the same material. The fourth insulating layer 110 is arranged to have an opening to form an under-bump material (UBM) 142. The solder ball 112 is formed on the under-bump material 142.

Figure 2:
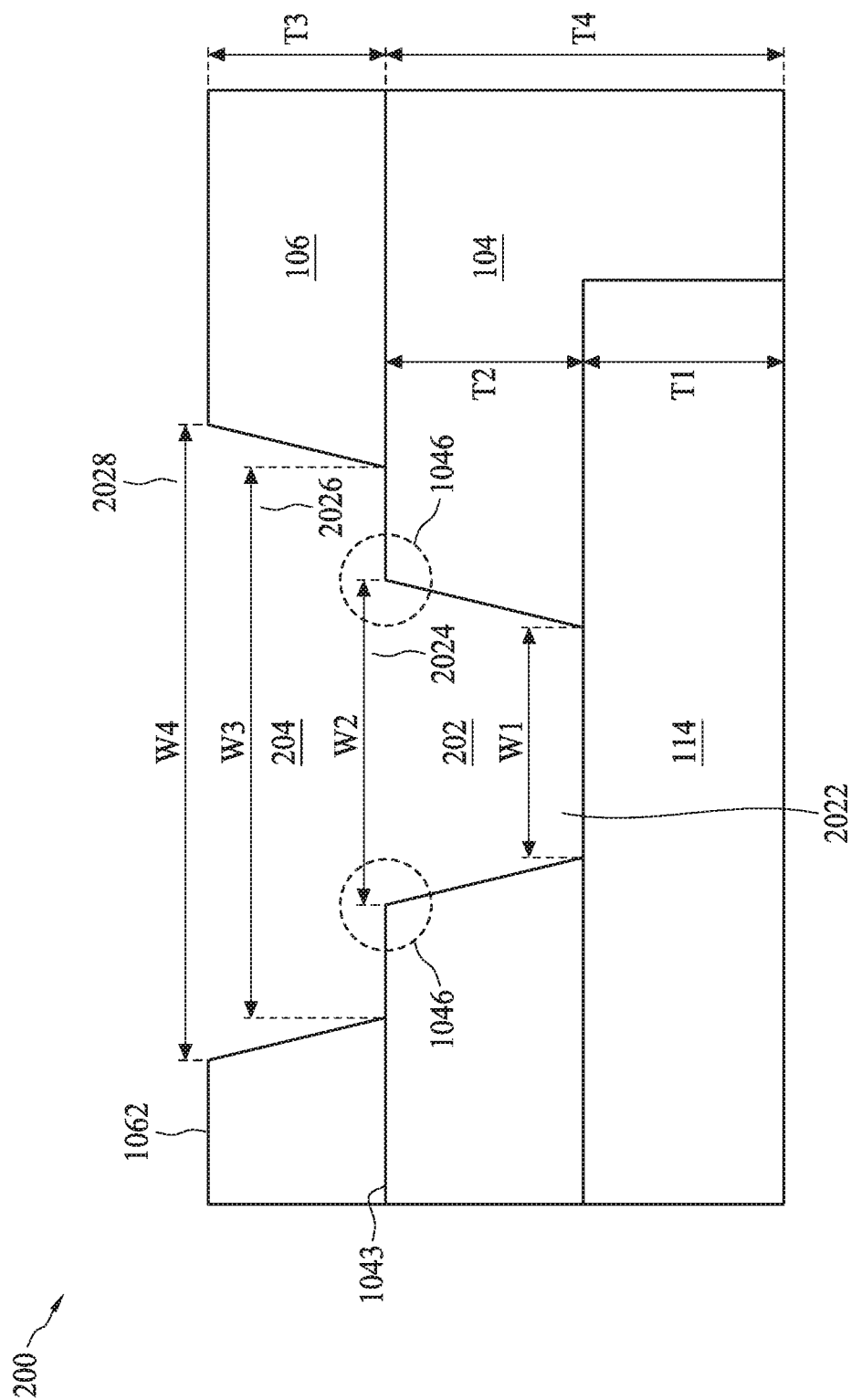
FIG. 2 is a diagram illustrating a detailed semiconductor structure of the portion 144 in the semiconductor device of FIG. 1 in accordance with some embodiments.

FIG. 2 is a diagram illustrating an enlarged semiconductor structure 200 of the portion 144 in the semiconductor device 100 in accordance with some embodiments. For brevity, the third insulating layer 108, the barrier seed layer 138, and the first via structure 134 are not shown in FIG. 2. In other words, the semiconductor structure 200 can be viewed as a semi-finished product of the first via structure 134. During this semi-finished stage, the semiconductor structure 200 is a hole structure. The semiconductor structure 200 comprises a first hole 202 and a second hole 204. The first hole 202 is formed in the first insulating layer 104 to expose the first conductive line 114. The second hole 204 is formed in the second insulating layer 106, and is aligned with or directly above the first hole 202. The diameter (or the opening) of the second hole 204 is greater than the diameter of the first hole 202. In particular, the first hole 202 has a first opening 2022 on a bottom level of the first insulating layer 104, and a second opening 2024 on a top level of the first insulating layer 104; the second hole 204 has a first opening 2042 on the bottom level of the second insulating layer 106, and a second opening 2044 on the top level of the second insulating layer 106. According to some embodiments, the bottom level of the first insulating layer 104 is on the top surface of the first conductive line 114, and the top level of the first insulating layer 104 is on the surface 1043. The bottom level of the second insulating layer 106 is on the surface 1043, and the top level of the second insulating layer 106 is on the surface 1062. The level of the surface 1043 can be viewed as an intermediate level between the top level and the bottom level. Moreover, the openings 2022, 2024, 2042, and 2044 have diameters W1, W2, W3, and W4 respectively. The diameter W2 is greater than the diameter W1. The diameter W3 is greater than the diameter W2. The diameter W4 is greater than the diameter W3. Accordingly, the sidewalls of the first hole 202 and the second hole 204 are tapered sidewall, and the kink structures 1046 are formed on the interface between the first hole 202 and the second hole 204. During the fabrication process, the kink structure and the taper profile can avoid the residue of the magnetic film 128 dropped into the first hole 202 and the second hole 204 when the magnetic film 128 is etched. The kink structure and the taper profile also have better step coverage of the barrier seed layer 138 such that the barrier seed layer 138 has thicker layer on the sidewalls of the first hole 202 and the second hole 204. The better step coverage of the barrier seed layer 138 can avoid the delamination of the barrier seed layer 138 in the first hole 202 and the second hole 204.

According to some embodiments, the diameter W1 is greater than 20 um, the diameter W3 is greater than 30 um.

In addition, the first conductive line 114 has a first thickness T1, the first insulating layer 104 on the first conductive line 114 has a second thickness T2, the second insulating layer 106 has a third thickness T3, and the first insulating layer 104 on the substrate 102 has a fourth thickness T4. Moreover, as shown in FIG. 1, a fifth thickness T5 is defined to be the length from the tip of the first concave 1041 to the substrate 102, and the width of the first trench 122 (i.e. the space between the first conductive line 114 and the second conductive line 116) is W.

According to some embodiments, the fourth thickness T4 is about 5 um~15 um, and the third thickness T3 is about 1 um~15 um.

According to some embodiments, a ratio from the second thickness T2 to the third thickness T3 is about 4:5. In other words, the depth of the first hole 202 is T2 and the depth of the second hole 204 T3, and a ratio from the depth T2 to the depth T3 is about 4:5.

According to some embodiments, when a thickness T6 of the first insulating layer 104 on the flat area 1106 equals the first thickness T1, and when a ratio from the first thickness T1 to the width W is about 7:10, then a ratio from the first thickness T1 to the second thickness T2 to the fifth thickness T5 is about 7:8:4. However, this is not a limitation of the present embodiment.

Figure 3:
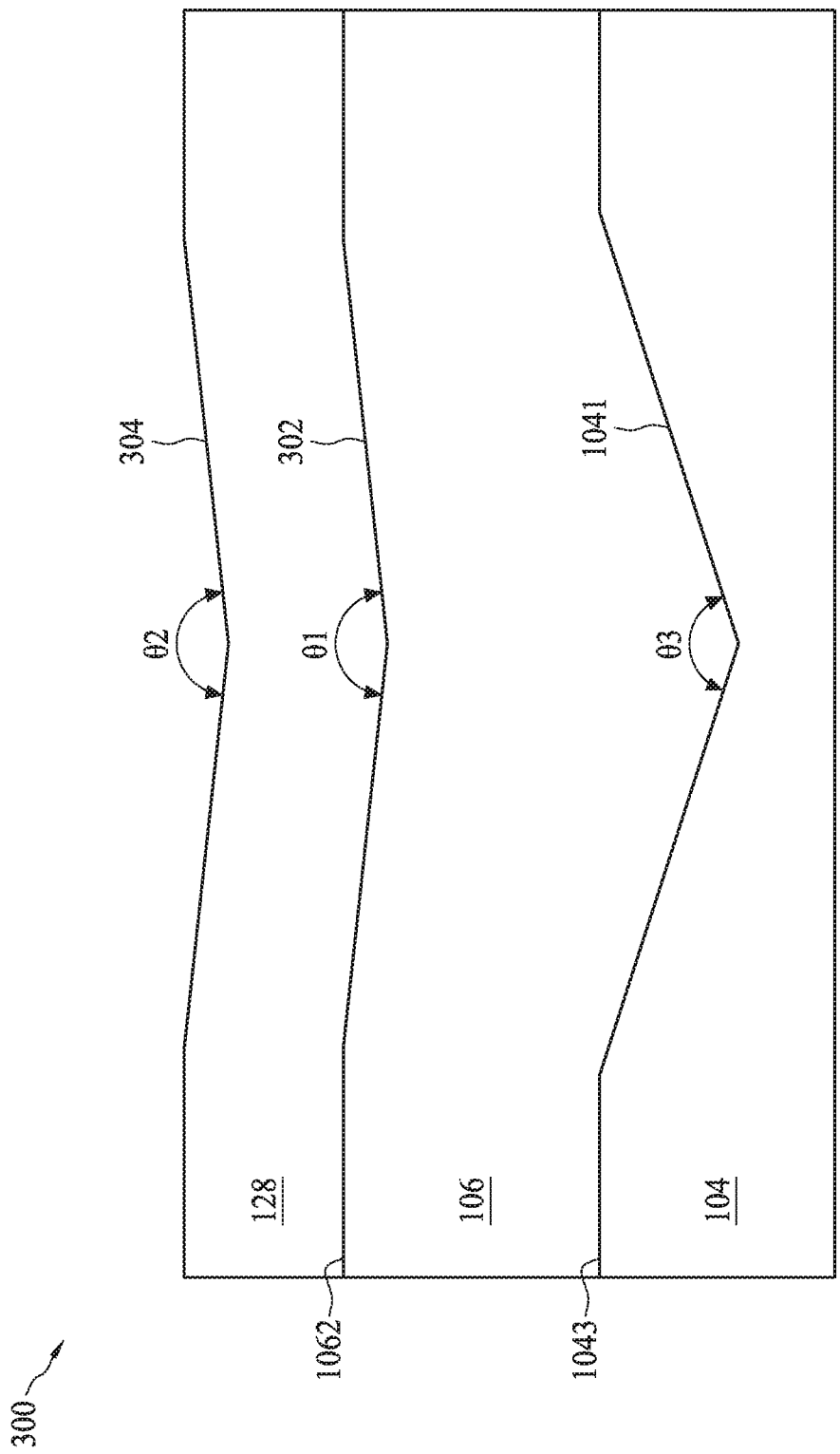
FIG. 3 is a diagram illustrating a detailed semiconductor structure of the portion 146 in the semiconductor device of FIG. 1 in accordance with some embodiments.

FIG. 3 is a diagram illustrating an enlarged semiconductor structure 300 of the portion 146 in the semiconductor device 100 in accordance with some embodiments. For brevity, the third insulating layer 108 is not shown in FIG. 3. In other words, the semiconductor structure 300 can be viewed as a semi-finished product of the magnetic film 128. In the semiconductor structure 300, the magnetic film 128 is disposed on the second insulating layer 106, and the second insulating layer 106 is disposed on the first insulating layer 104. The first concave 1041 is formed on the interface (i.e. 1043) between the first insulating layer 104 and the second insulating layer 106. As mentioned in the above paragraphs, the surface 1062 of the second insulating layer 106 may not be an ideal planar surface. A concave 302 may be formed in directly above the first concave 1041. When the magnetic film 128 is disposed on the surface 1062 of the second insulating layer 106, a concave 304 may also be formed directly above the concave 304. According to some embodiments, the obtuse angles θ1 and θ2 of the concaves 302 and 304 are at least 170 degree. Therefore, the surface 1062 directly above the first concave 1041 is close to the ideal planar surface, and the magnetic film 128 is almost a planar thin film. Accordingly, the inductance performance, such as the magnetic permeability, of the thin film inductor is improved. According to some embodiments, the obtuse angle θ3 of the first concave 1041 is about 150 degree.

Figure 4:
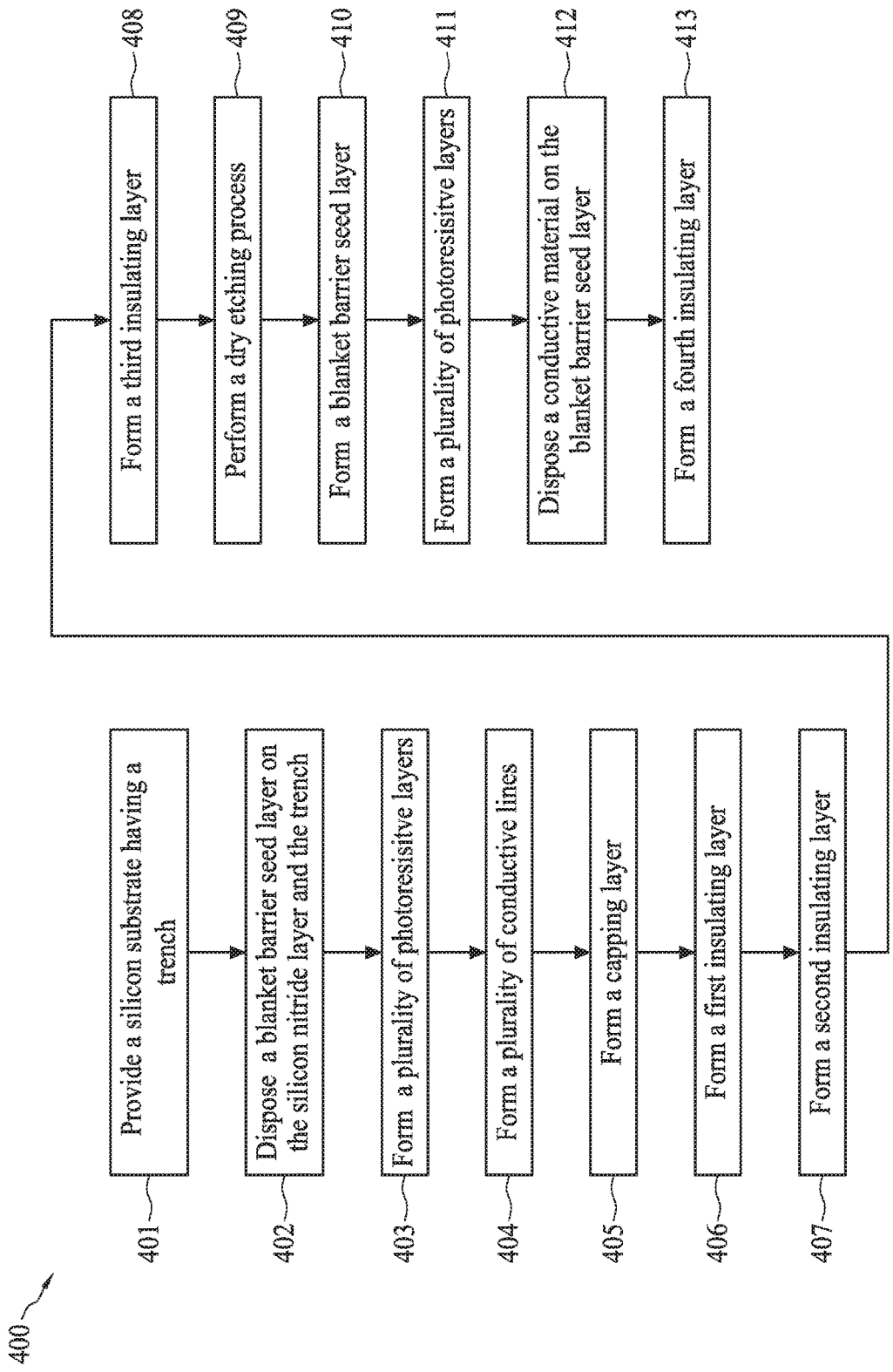
FIG. 4 is a flow diagram illustrating a method of fabricating a semiconductor device in accordance with some embodiments.

FIG. 4 is a flow diagram illustrating a method 400 of fabricating the semiconductor device 100 in accordance with some embodiments. The method 400 includes several operations, which are discussed in detail with reference to FIGS. 5 to 17. The method 400 is a wafer-level operation for fabricating a wafer-level semiconductor device. However, for brevity, FIGS. 5 to 17 merely show a portion of the cross-sectional view of the device during the fabrication. In operation 401, a silicon substrate having a trench is provided. In operation 402, a blanket barrier seed layer is sputtered or disposed on the silicon nitride layer and the trench. In operation 403, a plurality of photoresisitve layers are formed or coated on the blanket barrier seed layer. In operation 404, a plurality of conductive lines are formed or plated on the blanket barrier seed layer. In operation 405, a capping layer is disposed on the silicon nitride layer, the trench, and the conductive lines. In operation 406, a first insulating layer is disposed on the capping layer. In operation 407, a second insulating layer is disposed on the first insulating layer. In operation 408, a third insulating layer is disposed on the second insulating layer, the magnetic film, the sidewalls of the openings. In operation 409, a dry etching process is performed. In operation 410, a blanket barrier seed layer is sputtered or disposed on the third insulating layer, the first conductive line, and the second conductive line. In operation 411, a plurality of photoresisitve layers are formed or coated on the blanket barrier seed layer. In operation 412, a conductive material is formed or plated on the blanket barrier seed layer. In operation 413, a fourth insulating layer is formed on the conductive path and the exposed third insulating layer.

FIGS. 5 to 17 have been simplified for a better understanding of the inventive concepts of the present disclosure.

Figure 5:
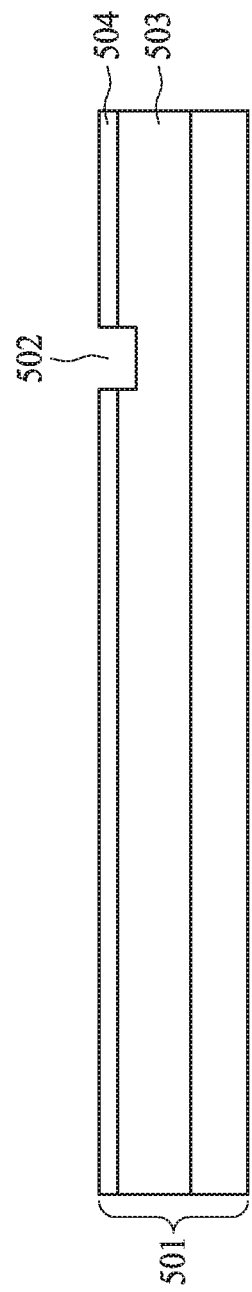
FIGS. 5 to 17 are cross-sectional views corresponding to various operations 401 to 413 in FIG. 4.

Referring to FIG. 5, in operation 401, a silicon substrate 501 having a trench 502 is provided. The silicon substrate 501 comprises an oxide layer 503 and a silicon nitride (SiN) layer 504. The trench 502 is an alignment mark. The trench 502 is etched to pass through the silicon nitride layer 504 and to reach the oxide layer 503. The thickness of the silicon nitride layer 504 is about 0.2 um.

Figure 6:
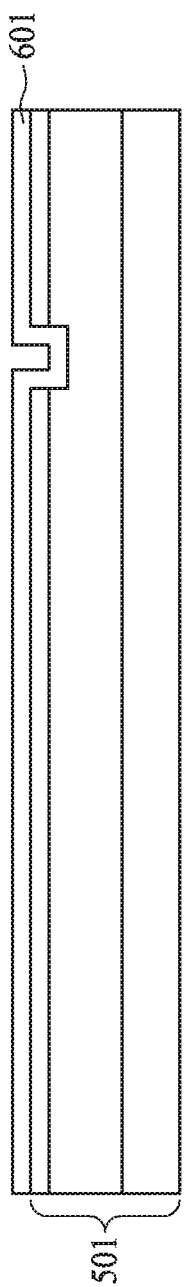

Referring to FIG. 6, in operation 402, a blanket barrier seed layer 601 is sputtered or disposed on the silicon nitride layer 504 and the trench 502. The blanket barrier seed layer 601 may be composed of titanium (Ti) or copper (Cu).

Figure 7:
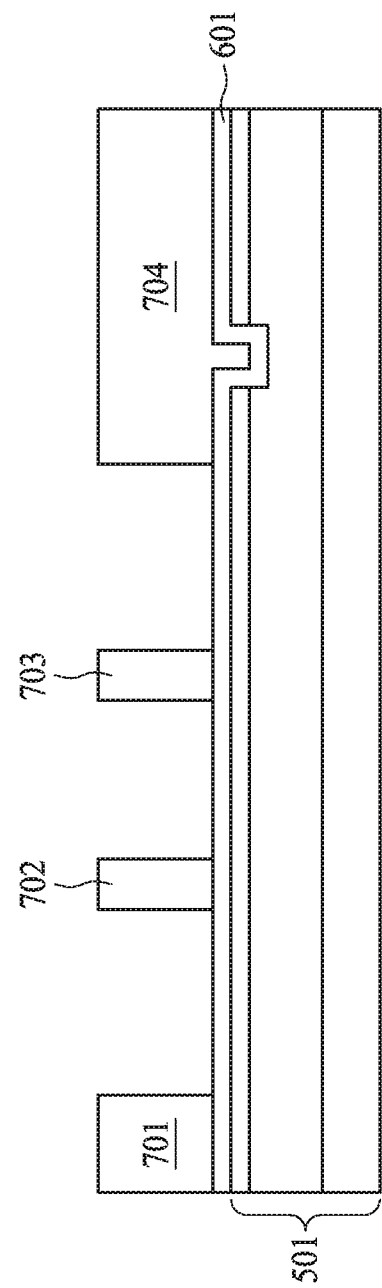

Referring to FIG. 7, in operation 403, a plurality of photoresisitve layers 701, 702, 703, and 704 are formed or coated on the blanket barrier seed layer 601.

Figure 8:
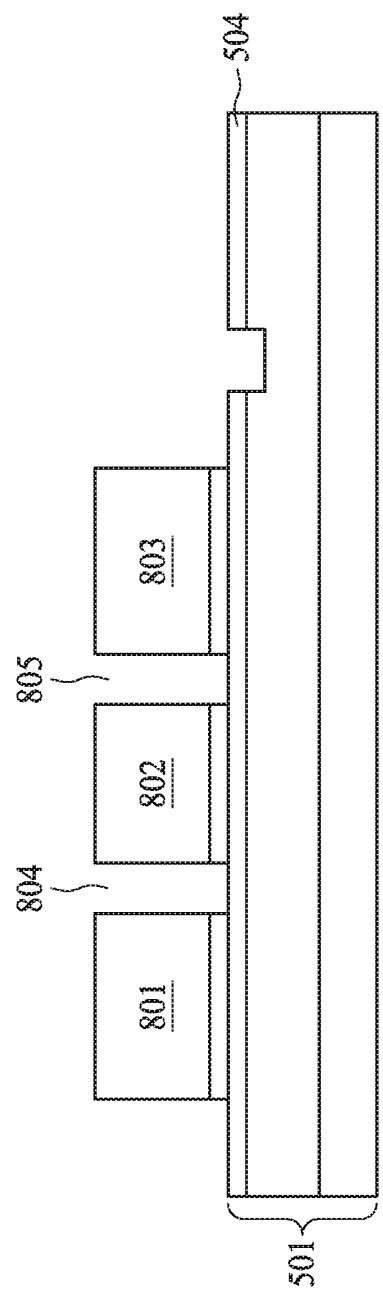

Referring to FIG. 8, in operation 404, a plurality of conductive lines 801, 802, and 803 are formed or plated on the area of the blanket barrier seed layer 601 that is not covered by the photoresisitve layers 701, 702, 703, and 704. Then, the photoresisitve layers 701, 702, 703, and 704, and the corresponding blanket barrier seed layers are etched or removed to expose the silicon nitride layer 504 and the trench 502. A first trench 804 and a second trench 805 are formed. The conductive lines 801, 802, and 803 are composed of copper.

Figure 9:
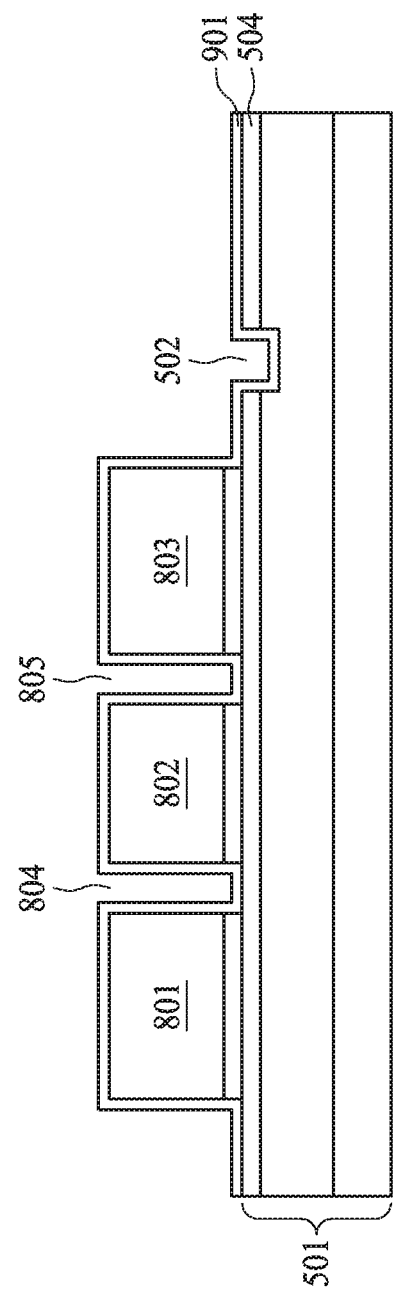

Referring to FIG. 9, in operation 405, a capping layer 901 is disposed on the silicon nitride layer 504, the trench 502, and the conductive lines 801, 802, and 803. The capping layer 901 may compose of silicon nitride.

Figure 10:
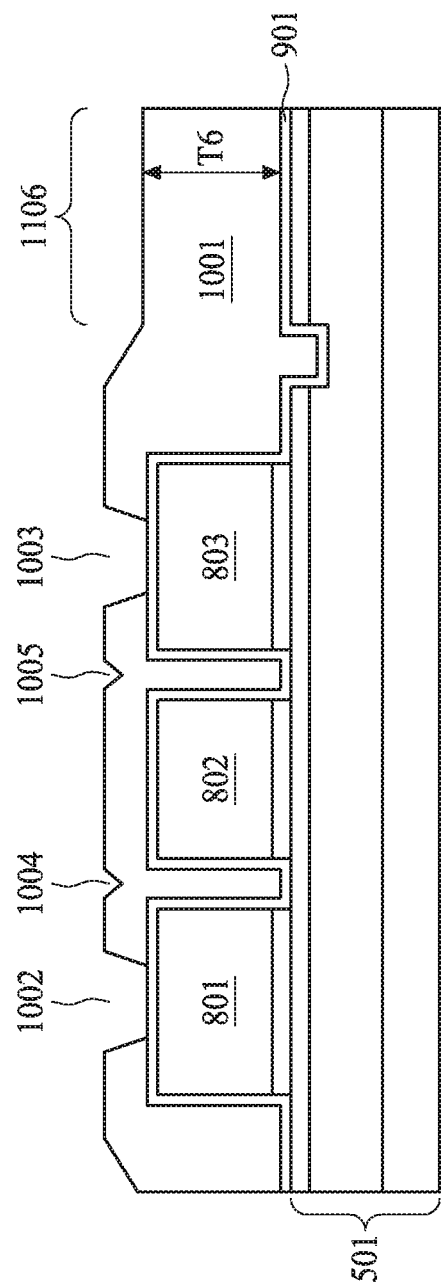

Referring to FIG. 10, in operation 406, a first insulating layer 1001 is disposed on the capping layer 901. A first opening 1002 and a second opening 1003 are formed on the first conductive line 801 and the third conductive line 803 respectively. The first opening 1002 and the second opening 1003 have tapered sidewalls. The first insulating layer 1001 undergoes a curing process. Due to the viscosity of the first insulating layer 1001, a first concave 1004 and a second concave 1005 are formed above the first trench 804 and the second trench 805 respectively. According to some embodiments, the first concave 1004 and the second concave 1005 have obtuse angles of about 150 degree.

Figure 11:
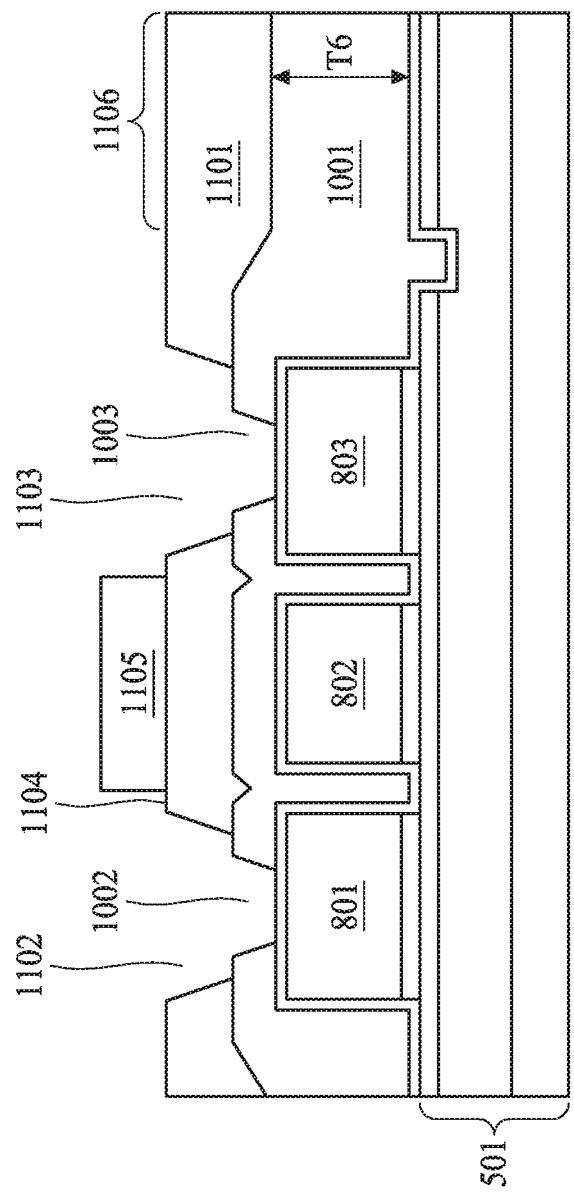

Referring to FIG. 11, in operation 407, a second insulating layer 1101 is disposed on the first insulating layer 1001. A first opening 1102 and a second opening 1103 are formed on the first opening 1002 and the second opening 1003 respectively. The first opening 1102 and the second opening 1103 have tapered sidewalls. According to some embodiments, the sidewalls of the first opening 1002 and the first opening 1102 has the same gradient or the same slope, and the sidewalls of the second opening 1003 and the second opening 1103 has the same gradient or the same slope. As shown in FIG. 3, a first concave and a second concave may be formed above the first concave 1004 and the second concave 1005 respectively. However, the obtuse angles of the first concave and the second concave are at least 170 degree. Therefore, the surface 1104 of the second insulating layer 1101 is almost a planar surface. A magnetic film 1105 is formed on the surface 1104 of the second insulating layer 1101. As the surface 1104 is a planar surface, the magnetic film 1105 is a planar film. According to some embodiments, the forming of the magnetic film 1105 may further comprise a deposition process, an annealing process, an photo etching process, a photoresisitve stripping process, and an annealing process. The detailed description of the above processes is omitted here for brevity.

Figure 12:
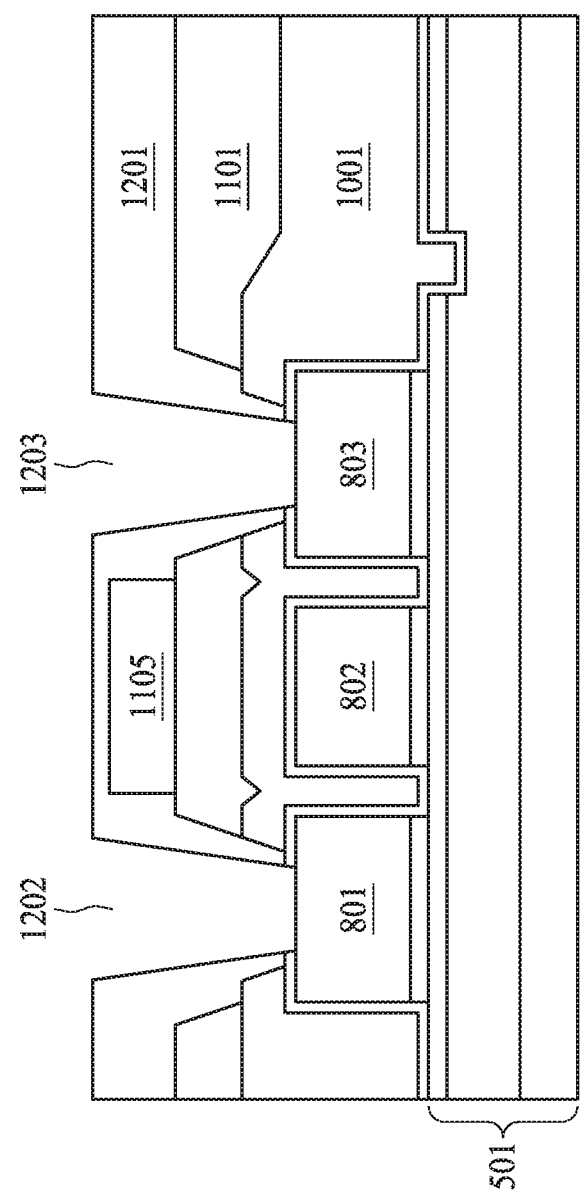

Referring to FIG. 12, in operation 408, a third insulating layer 1201 is disposed on the second insulating layer 1101, the magnetic film 1105, the sidewalls of the openings 1002, 1003, 1102, and 1103. A first via hole 1202 and a second via hole 1203 are formed.

Figure 13:
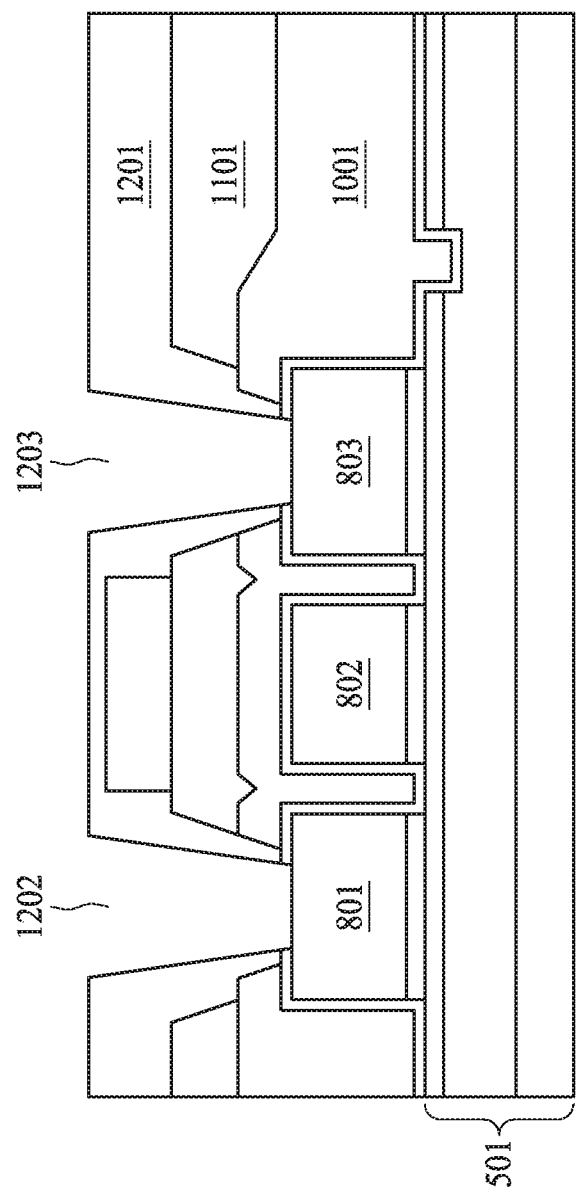

Referring to FIG. 13, in operation 409, a dry etching process is performed upon the first via hole 1202 and the second via hole 1203 to remove the capping layer 901 on the first conductive line 801 and the second conductive line 803.

Figure 14:
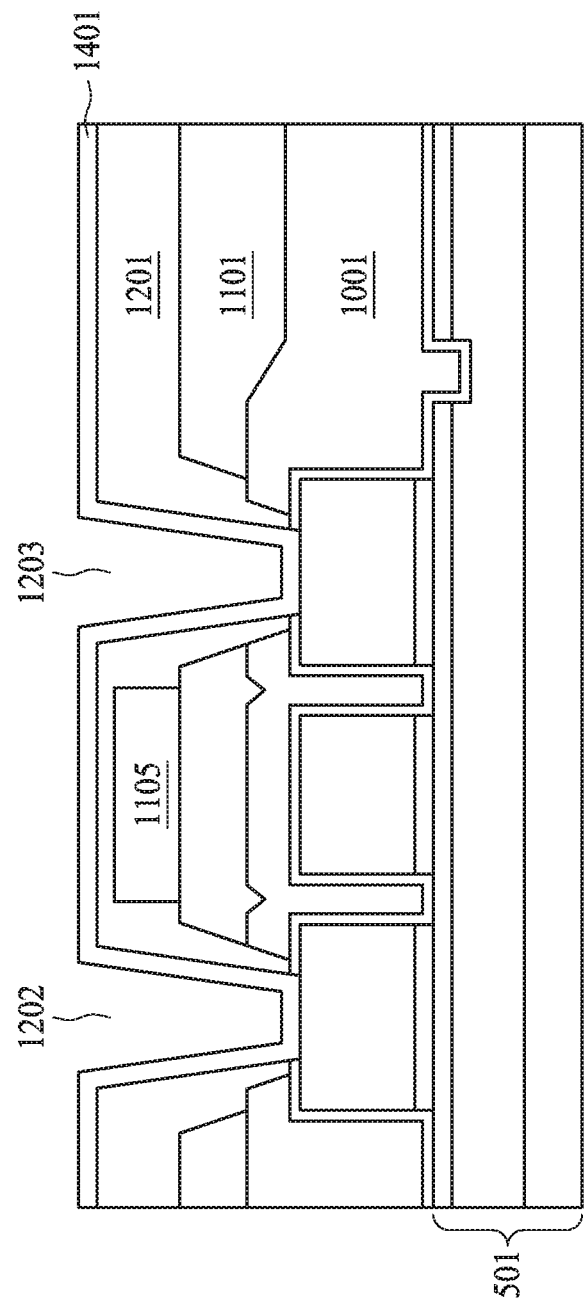

Referring to FIG. 14, in operation 410, a blanket barrier seed layer 1401 is sputtered or disposed on the third insulating layer 1201, the first conductive line 801, the second conductive line 803, and the sidewalls of the first via hole 1202 and the second via hole 1203. The blanket barrier seed layer 1401 may be composed of titanium (Ti) or copper (Cu).

Figure 15:
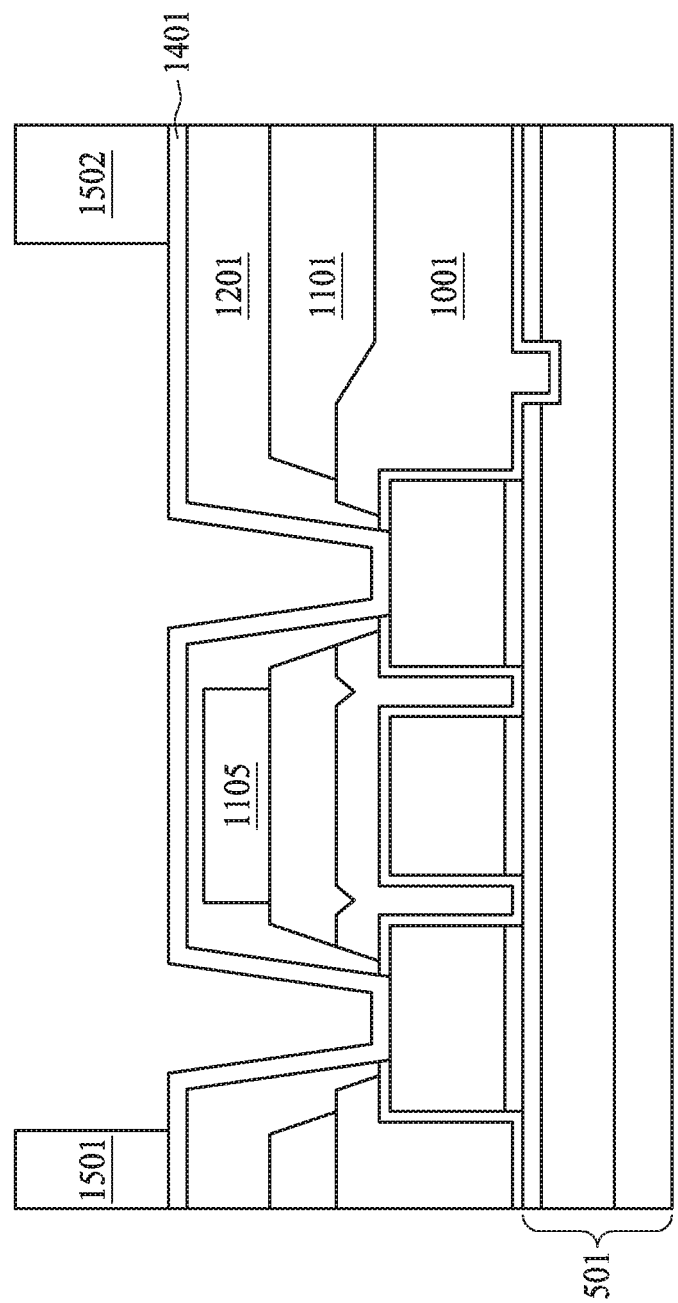

Referring to FIG. 15, in operation 411, a plurality of photoresisitve layers 1501 and 1502 are formed or coated on the blanket barrier seed layer 1401.

Figure 16:
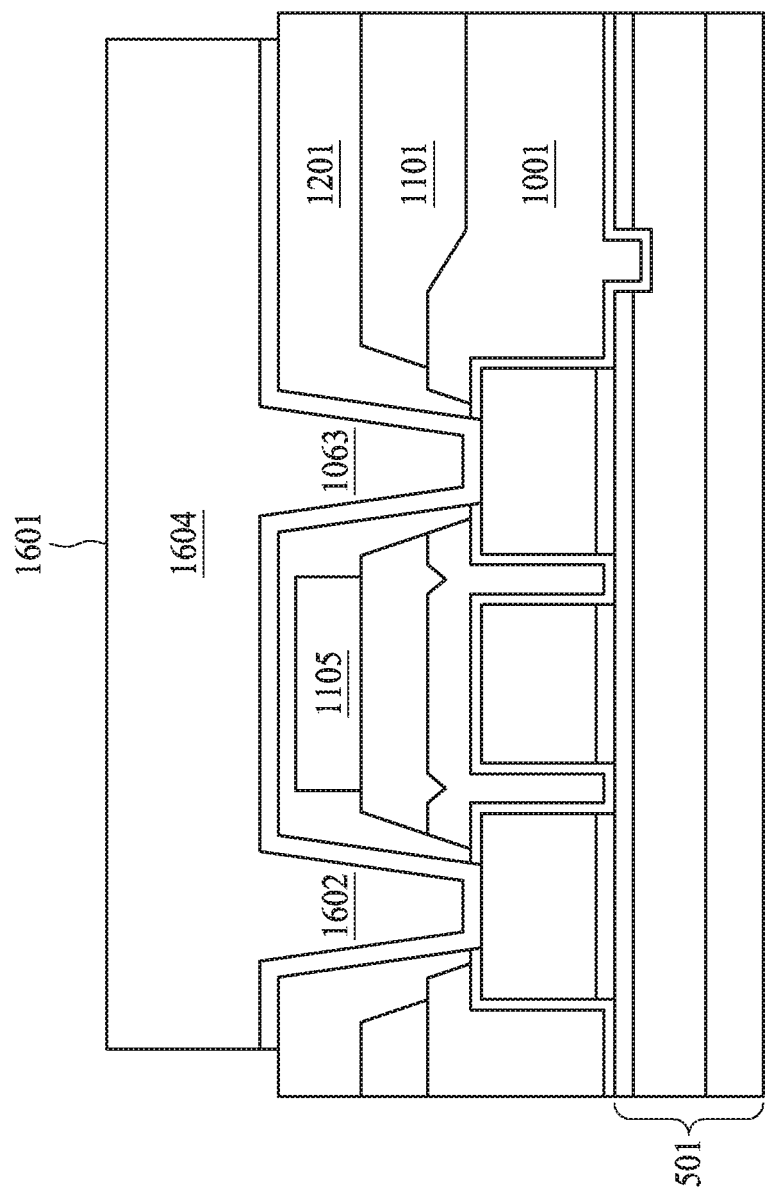

Referring to FIG. 16, in operation 412, a conductive material 1601 is formed or plated on the area of the blanket barrier seed layer 1401 that is not covered by the photoresisitve layers 1501 and 1502. Then, the photoresisitve layers 1501 and 1502, and the corresponding blanket barrier seed layers are stripped or removed to expose the third insulating layer 1201. Accordingly, a first via 1602, a second via 1603, and a conductive path 1604 are formed. The conductive material may be copper.

Figure 17:
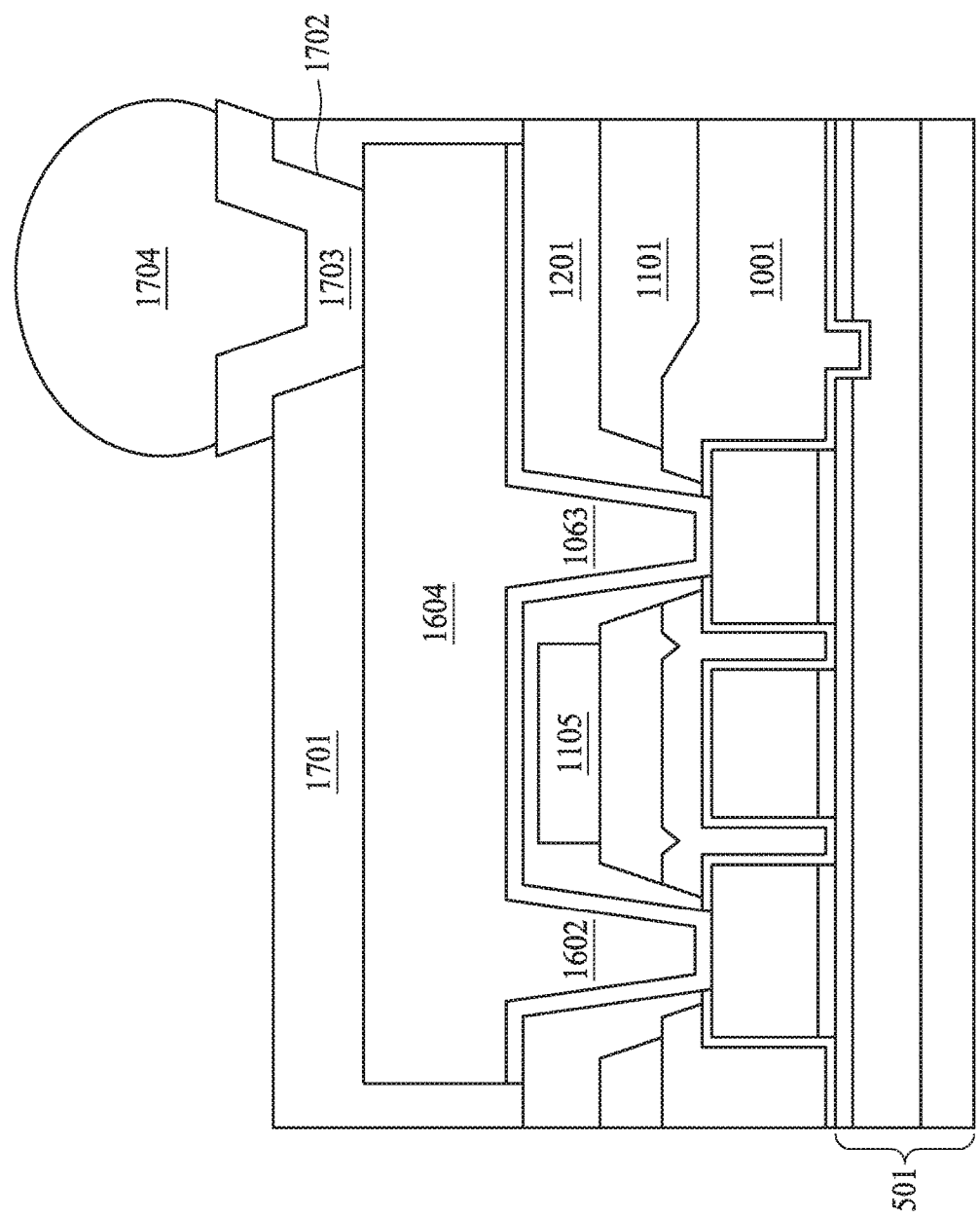

Referring to FIG. 17, in operation 413, a fourth insulating layer 1701 is formed on the conductive path 1604 and the exposed third insulating layer 1201. The fourth insulating layer 1701 is arranged to have an opening 1702 to form an under-bump material (UBM) 1703. A solder ball 1704 is formed on the under-bump material 1703. According to some embodiments, the operation 412 may further comprise a coating/exposure/developing/curing process, an UBM seed layer sputtering process, an UBM photoresistive (PR) layer coating process, an UBM PR exposure and developing process, an UBM copper plating process, a PR stripping process, an UBM seed layer metal etching process, a ball mounting process, and/or a Cu bumping process. The detailed description of the above processes is omitted here for brevity. In operation 413, a thin film inductor (e.g. the semiconductor device 100) with a stable magnetic permeability is fabricated.

Briefly, according to the present semiconductor device, the concave of the first PBO layer above the trench between two metal lines is planarized by disposing a second PBO layer on the first PBO layer. Accordingly, the CZT film disposed on the second PBO layer is not affected by the concave of the first PBO layer. Thus, the CZT film is a planar film. Moreover, the opening of the via structure is a taper opening with a kink structure. The kink structure and the taper profile have better step coverage for the barrier seed layer. The better step coverage of the barrier seed layer can avoid the delamination of the barrier seed layer.

According to some embodiments, a semiconductor device is provided. The semiconductor device comprises a first conductive line, a second conductive line, an insulating layer, and a magnetic film. The first conductive line is disposed on a substrate. The second conductive line is disposed on the substrate, and the second conductive line separated with the first conductive line by a trench. The insulating layer is disposed on the first conductive line and the second conductive line, and filled the trench between the first conductive line and the second conductive line. The magnetic film has a first surface and a second surface opposite to the first surface, and the first surface disposed on the insulating layer. The first surface has a first concave directly above the trench, and the first concave has a first obtuse angle of at least 170 degree.

According to some embodiments, a semiconductor device is provided. The semiconductor device comprises a first conductive line, a second conductive line, an insulating layer, and a magnetic film. The first conductive line is disposed on a substrate. The second conductive line is disposed on the substrate, and the second conductive line separated with the first conductive line by a trench. The insulating layer is disposed on the first conductive line and the second conductive line, and filled the trench between the first conductive line and the second conductive line. The magnetic film is disposed on the insulating layer. The magnetic film is positioned directly above the trench, and an interface between the magnetic film and the insulating layer is a planar interface.

According to some embodiments, a method of forming a semiconductor device is provided. The method comprises: forming a first conductive line and a second conductive line on a substrate, wherein the second conductive line is separated with the first conductive line by a trench; disposing a first insulating layer on the first conductive line and the second conductive line to fill the trench between the first conductive line and the second conductive line; disposing a second insulating layer on the first insulating; and disposing a magnetic film on the second insulating layer, wherein the magnetic film has a first surface and a second surface opposite to the first surface, and the first surface is disposed on the second insulating layer; wherein the first surface has a first concave directly above the trench, and the first concave has a first obtuse angle of at least 170 degree.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first conductive line, disposed on a substrate;
   a second conductive line, disposed on the substrate, and the second conductive line separated with the first conductive line by a trench;
   a first insulating layer, disposed on the first conductive line and the second conductive line, and filled the trench between the first conductive line and the second conductive line;
   a second insulating layer, disposed on the first insulating layer; and
   a magnetic film, having a first surface and a second surface opposite to the first surface, and the first surface disposed on the second insulating layer;
   wherein the first surface directly above the trench is a planar surface.

2. The semiconductor device of claim 1, wherein the second surface directly above the trench is a planar surface.

3. The semiconductor device of claim 1, further comprising:
   a via structure, disposed on the first conductive line and surrounded by the first insulating layer, and a diameter of the via structure monotonically decrease towards the first conductive line.

4. The semiconductor device of claim 3, wherein the via structure is not overlapped with the magnetic film in a vertical direction above the first conductive line.

5. The semiconductor device of claim 3, wherein the first insulating layer comprises a first hole, arranged to expose the first conductive line; and the second insulating layer comprises a second hole, directly above the first hole;
   wherein the via structure is formed in the first hole and the second hole, and a diameter of the second hole is greater than a diameter of the first hole.

6. The semiconductor device of claim 5, wherein a kink structure is formed on an interface between the first hole and the second hole.

7. The semiconductor device of claim 5, wherein the first hole has a first depth, the second hole has a second depth, and a ratio from the first depth to the second depth is about 4:5.

8. The semiconductor device of claim 5, wherein the first hole has a first tapered sidewall and the second hole has a second tapered sidewall.

9. The semiconductor device of claim 8, wherein the first tapered sidewall and the second tapered sidewall have a same gradient.

10. A semiconductor device, comprising:
    a first conductive line, disposed on a substrate;
    a second conductive line, disposed on the substrate, and the second conductive line separated with the first conductive line by a trench;
    a first insulating layer, disposed on the first conductive line and the second conductive line, and filled the trench between the first conductive line and the second conductive line;
    a second insulating layer, disposed on the first insulating layer; and
    a magnetic film, disposed on the second insulating layer;
    wherein a first interface directly above the trench and between the first insulating layer and the second insulating layer has a first concave in an obtuse angle of about 150 degree.

11. The semiconductor device of claim 10, further comprising:
    a via structure, disposed on the first conductive line and surrounded by the first insulating layer, and a diameter of the via structure monotonically decrease towards the first conductive line.

12. The semiconductor device of claim 11, wherein the first insulating layer comprises a first hole, arranged to expose the first conductive line; and the second insulating layer comprises a second hole, directly above the first hole;
    wherein the via structure is formed in the first hole and the second hole, and a diameter of the second hole is greater than a diameter of the first hole.

13. The semiconductor device of claim 12, wherein a kink structure is formed on a second interface between the first hole and the second hole.

14. The semiconductor device of claim 12, wherein the first hole has a first depth, the second hole has a second depth, and a ratio from the first depth to the second depth is about 4:5.

15. The semiconductor device of claim 12, wherein the first hole has a first tapered sidewall and the second hole has a second tapered sidewall.

16. A semiconductor device, comprising:
a first conductive line, disposed on a substrate;
a second conductive line, disposed on the substrate, and the second conductive line separated with the first conductive line by a trench;
an insulating structure, disposed on the first conductive line and the second conductive line, and filled the trench between the first conductive line and the second conductive line;
a magnetic film, disposed on the insulating structure;
an insulating layer, surrounding the magnetic film; and
a via structure, disposed on the first conductive line and surrounded by the insulating structure and the insulating layer;
wherein a kink structure is formed between the insulating layer and the insulating structure.

17. The semiconductor device of claim 16, wherein the magnetic film has a first concave directly above the trench, and the first concave has an obtuse angle of at least 170 degree.

18. The semiconductor device of claim 16, wherein the insulating structure comprises:
a first insulating layer, disposed on the first conductive line and the second conductive line; and
a second insulating layer, partially disposed on the first insulating layer to form the kink structure.

19. The semiconductor device of claim 16, wherein a diameter of the via structure monotonically decrease towards the first conductive line.

20. The semiconductor device of claim 18, wherein an interface between the first insulating layer and the second insulating layer has a second concave in an obtuse angle of about 150 degree.

* * * * *